United States Patent
Kasai et al.

(10) Patent No.: US 7,045,417 B2
(45) Date of Patent: May 16, 2006

(54) METHOD OF MANUFACTURING SEMICONDUCTOR DEVICE

(75) Inventors: Yoshio Kasai, Oita (JP); Miki Kawase, Tokyo (JP); Takashi Suzuki, Yokohama (JP); Motoya Kishida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/061,531

(22) Filed: Feb. 22, 2005

(65) Prior Publication Data

US 2005/0196914 A1    Sep. 8, 2005

(30) Foreign Application Priority Data

Feb. 24, 2004    (JP)    ............... 2004-048167

(51) Int. Cl.
*H01L 21/8242*    (2006.01)
(52) U.S. Cl. ............... 438/243; 438/247; 438/389; 438/558
(58) Field of Classification Search ........ 438/243–249, 438/386–392, 558
See application file for complete search history.

(56) References Cited

U.S. PATENT DOCUMENTS

| 5,360,758 A | 11/1994 | Bronner et al. |
| 6,110,792 A | 8/2000 | Bronner et al. |
| 6,372,589 B1 * | 4/2002 | Yu ............... 438/304 |

* cited by examiner

*Primary Examiner*—H. Jey Tsai
(74) *Attorney, Agent, or Firm*—Finnegan, Henderson, Farabow, Garrett & Dunner, L.L.P.

(57) ABSTRACT

A method of manufacturing a semiconductor device, which comprises forming a first semiconductor film on a surface of a semiconductor substrate, adsorbing a first impurity on a surface of the first semiconductor film, adsorbing a second impurity on the surface of the first semiconductor film, forming a second semiconductor film on the surface of the first semiconductor film, and solid-phase-diffusing the first impurity and the second impurity into a region of the semiconductor substrate which is located adjacent to the first and second semiconductor films to thereby form a first diffusion region containing the first impurity and a second diffusion region containing the second impurity, a concentration of the first impurity in the first diffusion region being higher than that of the second impurity in the second diffusion region, and the first diffusion region having the bottom thereof covered by the second diffusion region.

19 Claims, 4 Drawing Sheets

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2004-048167, filed Feb. 24, 2004, the entire contents of which are incorporated herein by reference.

BACKGROUND OF THE INVENTION

1. Field of the Invention

This invention relates to a method of manufacturing a semiconductor device, in particular, to the formation of an electric conductive region through the solid phase diffusion of impurities.

2. Description of the Related Art

As for the memory cell structure of DRAM which is constituted by one MOS transistor and one capacitor, there is known a trench type cell wherein a trench is formed in a semiconductor substrate and the inner wall portion of the trench is employed as a capacitor. In this trench type DRAM cell, the source/drain of MOS transistor is required to be electrically connected with one of the electrodes of the capacitor.

As for the technique for connecting the source/drain of MOS transistor to one of the electrodes of the capacitor, there is known a method wherein As(arsenic)-doped polycrystalline silicon is buried in a deep trench formed in a semiconductor substrate and As in the As-doped polycrystalline silicon is caused to diffuse through solid phase diffusion from the side-wall of upper portion of the trench, thereby forming an As diffusion region in the semiconductor substrate (see, for example, U.S. Pat. No. 5,360,758 and U.S. Pat. No. 6,110,792).

As for the method to minimize the junction leak current from a high-concentration As diffusion region which is formed by making use of the aforementioned method, it is conceivable to fabricate a structure where the high-concentration As diffusion region is enclosed by a low concentration P (phosphorus) diffusion region.

This structure can be fabricated by a method wherein P is introduced, through ion-implantation, into the As-doped polycrystalline silicon buried in the trench, thereby effecting the solid phase diffusion of As and P from the polycrystalline silicon. However, the doping of P by means of ion-plantation is accompanied with a problem that the introduction of P into a predetermined depth in the vertical direction is limited, thereby raising various problems. For example, when it is desired to introduce P into a deep region of the trench by means of ion-implantation using a high accelerating voltage of several tens KeV, a long period of heat treatment is required due to a long distance required for achieving the solid phase diffusion, thereby making it impossible to suitably control the diffusion region. As a result, the P thus diffused may badly affect the neighboring transistor which is spaced away by a distance of 500 angstroms from the edge of the trench, thereby raising problems such as the punch-through of transistor.

When P is introduced into a shallow region of the trench through ion-implantation using, for example, a low accelerating voltage of 5 KeV or less in order to inhibit the generation of the aforementioned phenomenon, it may be possible to form a diffusion region of P at a surface region of the As-doped polycrystalline silicon layer, thus making it possible to cover the top surface of As-doped polycrystalline silicon layer with a P diffusion region. However, it is difficult to cover the bottom of the As-doped polycrystalline silicon layer with a P diffusion region by diffusing P into a depth of 1000 angstroms or so. Therefore, it has been impossible to sufficiently enclose the As diffusion region with a low concentration P diffusion region, thus making it difficult to minimize the junction leak current at the As diffusion region.

BRIEF SUMMARY OF THE INVENTION

According to an aspect of the present invention, there is provided a method of manufacturing a semiconductor device, which comprises forming a first semiconductor film including polycrystalline silicon or amorphous silicon on a surface of a semiconductor substrate; adsorbing a first impurity on a surface of the first semiconductor film; adsorbing a second impurity on the surface of the first semiconductor film having the first impurity adsorbed thereon; forming a second semiconductor film made of polycrystalline silicon or amorphous silicon on the surface of the first semiconductor film having the first and second impurities adsorbed thereon; and solid-phase-diffusing the first impurity and the second impurity into a region of the semiconductor substrate which is located adjacent to the first and second semiconductor films to thereby form a first diffusion region containing the first impurity and a second diffusion region containing the second impurity, a concentration of the first impurity in the first diffusion region being higher than that of the second impurity in the second diffusion region, and the first diffusion region having the bottom thereof covered by the second diffusion region.

Additionally, according to another aspect of the present invention, there is provided a method of manufacturing a semiconductor device, which comprises the steps of forming a first semiconductor film including polycrystalline silicon or amorphous silicon on a surface of a semiconductor substrate; adsorbing a first impurity on a surface of the first semiconductor film; adsorbing a second impurity on the surface of the first semiconductor film in the middle of the previous step of applying the first impurity to the surface of the first semiconductor film; forming a second semiconductor film including polycrystalline silicon or amorphous silicon on the surface of the first semiconductor film having the first and second impurities adsorbed thereon; and solid-phase-diffusing the first impurity and the second impurity into a region of the semiconductor substrate which is located adjacent to the first and second semiconductor films to thereby form a first diffusion region containing the first impurity and a second diffusion region containing the second impurity, a concentration of the first impurity in the first diffusion region being higher than that of the second impurity in the second diffusion region, and the first diffusion region having the bottom thereof covered by the second diffusion region.

DETAILED DESCRIPTION OF THE INVENTION

Embodiments of the present invention will now be explained with reference to drawings.

In the method of manufacturing a semiconductor device according to one embodiment of the present invention, a first impurity and a second impurity are successively adsorbed onto the surface of a first semiconductor film. Whereas, in the method of manufacturing a semiconductor device according to another embodiment of the present invention, the first impurity is adsorbed onto the surface of the first semiconductor film and then, in the middle of this first impurity adsorption step, the second impurity is adsorbed, together with the first impurity, onto the surface of the first semiconductor film. According to these manufacturing methods of semiconductor device, since the second impurity is adsorbed onto the surface of the first semiconductor film which has been adsorbed, in advance, with the first impurity, the quantity of the first impurity and the second impurity can be easily controlled so as to enable the first impurity to be adsorbed at a higher concentration while enabling the second impurity to be adsorbed at a lower concentration.

These adsorption steps may preferably be repeated a plurality of times with a step of forming a semiconductor film being interposed between these adsorption steps. The number of this repetition of steps may be suitably determined by taking into consideration the quantity of impurities required to be adsorbed and the thickness of the film. In this case, in order to adjust the magnitude of difference in quantity of adsorption between the quantity of the adsorbed first impurity and the quantity of the adsorbed second impurity, at least one of the repetitions of abovementioned sequential steps may be performed without including the step of adsorbing the second impurity.

Further, it is preferable that the second impurity has a larger diffusion coefficient than that of the first impurity. These first impurity and second impurity may be of the same conductivity type with each other and can be suitably selected from the group consisting of As, P, Sb, B, Al, Ga and In.

When the second impurity is selected from those having a larger diffusion coefficient than that of the first impurity, the second impurity is enabled to diffuse deeper than the first impurity in a subsequent heating step, thereby making it possible to reliably create a region containing a higher concentration of the first impurity and having the bottom covered with a region containing a lower concentration of the second impurity.

The concentration of the first impurity in the region containing the first impurity may preferably be 5 to 1000 times larger than the concentration of the second impurity in the region containing the second impurity. The reason for this is that when the present embodiment is applied to a DRAM cell, the buried strap for connecting the capacitor electrode with the source of drain electrode of MOSFET would be enabled to be constituted by a region containing a higher concentration of the first impurity and having the bottom covered with a region containing a lower concentration of the second impurity.

If the concentration of the first impurity in the region containing the first impurity is less than 5 times as large as that of the second impurity in the region containing the second impurity, the concentration of the second impurity in the region containing the second impurity would become too high so that problems such as the punch-through of transistor would occur depending on the magnitude of the diffusion coefficient of the second impurity. On the other hand, if the concentration of the first impurity in the region containing the first impurity is more than 1000 times as large as that of the second impurity in the region containing the second impurity, the concentration of the second impurity in the region containing the second impurity would become too low so that it would be very difficult to obtain the effects of minimizing the junction leak current of the region containing the first impurity.

The adsorption of the first impurity and the second impurity onto the surface of the semiconductor film can be performed by exposing the semiconductor film to gas containing the first impurity and to gas containing the second impurity. The quantities of the adsorbed first impurity and the adsorbed second impurity can be controlled by controlling the partial pressure of the gas containing the first impurity and the partial pressure of the gas containing the second impurity.

In particular, when the adsorption of the second impurity is to be performed in the middle of the step of adsorbing the first impurity, the ratio in partial pressure between the gas containing the first impurity and the gas containing the second impurity is suitably adjusted, thereby making it possible to control the quantities of adsorption of the first and second impurities to desired values. As a result, it is now possible to optimize the impurity concentration of the region containing the first impurity as well as the impurity concentration of the region containing the second impurity.

For example, when As is selected as the first impurity and P is selected as the second impurity, $AsH_3$ can be employed as the gas containing the first impurity and $PH_3$ can be employed as the gas containing the second impurity. Then, the ratio in partial pressure between these gases ($AsH_3/PH_3$) is suitably selected from the range of 1 to 50 to thereby suitably control the quantity of adsorption of each of the first and second impurities so as to obtain a prescribed concentration of the first impurity in the region containing the first impurity and a prescribed concentration of the second impurity in the region containing the second impurity (for example, the concentration of the first impurity is made 5 to 1000 times larger than the concentration of the second impurity).

FIGS. 1A to 1D are cross-sectional views illustrating, in the order of steps, the method of manufacturing the DRAM trench cell according to one embodiment of the present invention.

Figure 1A:
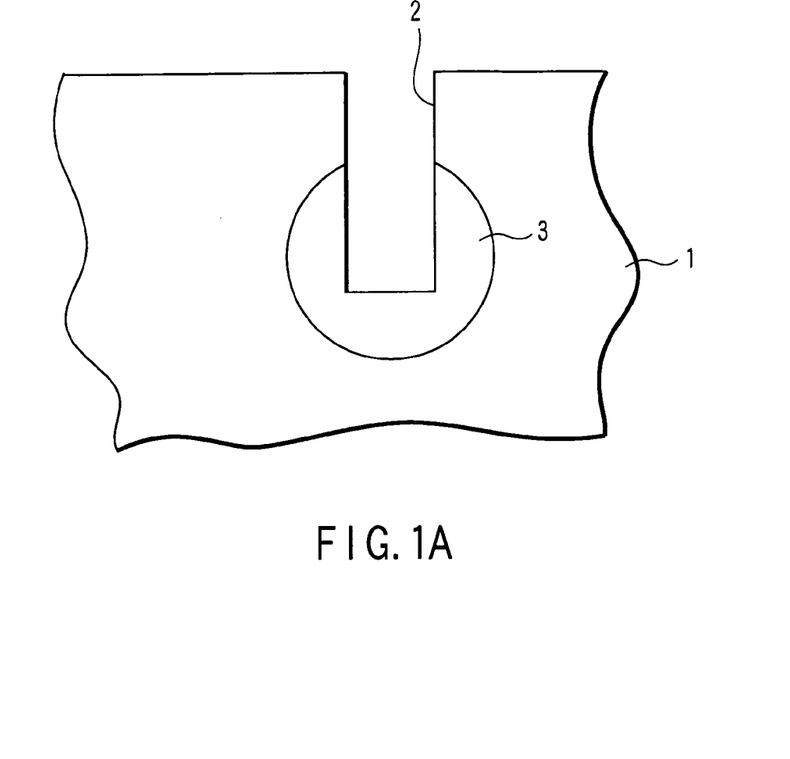
FIGS. 1A to 1D are cross-sectional views illustrating, in the order of steps, the method of manufacturing the DRAM trench cell according to one embodiment of the present invention.

First of all, as shown in FIG. 1A, a trench 2 is formed on a monocrystalline silicon substrate 1 and then the doping of As is effected from the inner surface of a lower portion of the trench 2 to form a plate electrode 3 constituted by a high concentration As diffusion region.

Then, the inner surface of the trench 2 is nitrided and oxidized to form an $SiN/SiO_2$ film. Thereafter, the trench 2 is filled with As-doped polycrystalline silicon.

Figure 1B:
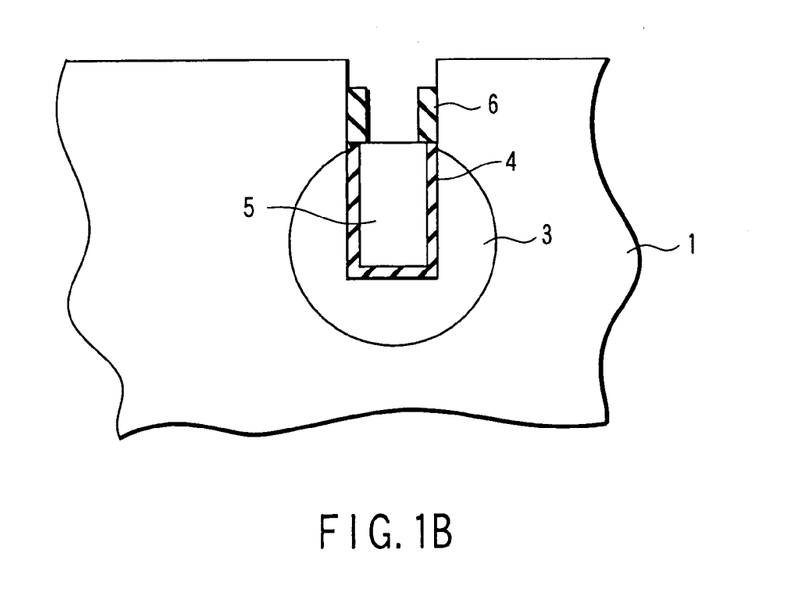

Subsequently, the As-doped polycrystalline silicon is subjected to reactive ion etching to recess-etch an upper portion of the As-doped polycrystalline silicon buried in the trench 2. Further, an exposed portion of the SiN/SiO$_2$ film formed on the inner surface of the trench 2 is removed by means of wet etching (etchant: H$_3$PO$_4$). As a result, as shown in FIG. 1B, a capacitor insulating film 4 consisting of the SiN/SiO$_2$ film which is left remained on a lower inner surface of the trench 2 is formed. At the same time, a storage node electrode 5 consisting of the As-doped polycrystalline silicon which is left remained on a lower portion of the trench 2 is formed.

Subsequently, after an SiO$_2$ film is formed on an upper inner surface of the trench 2, the SiO$_2$ film is subjected to reactive ion etching, thereby removing bottom and upper portions of the SiO$_2$ film and forming a collar oxide film 6 (FIG. 1B).

Figure 2:
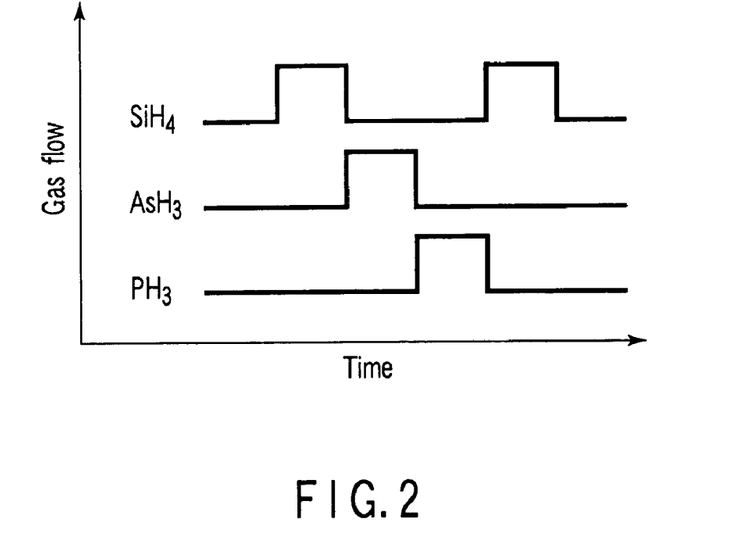
FIG. 2 is a graph illustrating, as one example, a sequence of each of gases to be employed in the formation of polycrystalline silicon containing both As and P.

Then, by following the procedure as indicated by the sequence of gas flow shown in FIG. 2, the formation of polycrystalline silicon as well as the adsorption of As and P on the upper surface of the storage node electrode 5 in the trench 2 are performed, thus burying As/P-containing polycrystalline silicon in the trench 2. Incidentally, the formation of polycrystalline silicon and the adsorption of As and P are performed under the conditions of: 450° C.–650° C. in temperature, and 0.05–5 Torr in pressure.

Figure 1C:
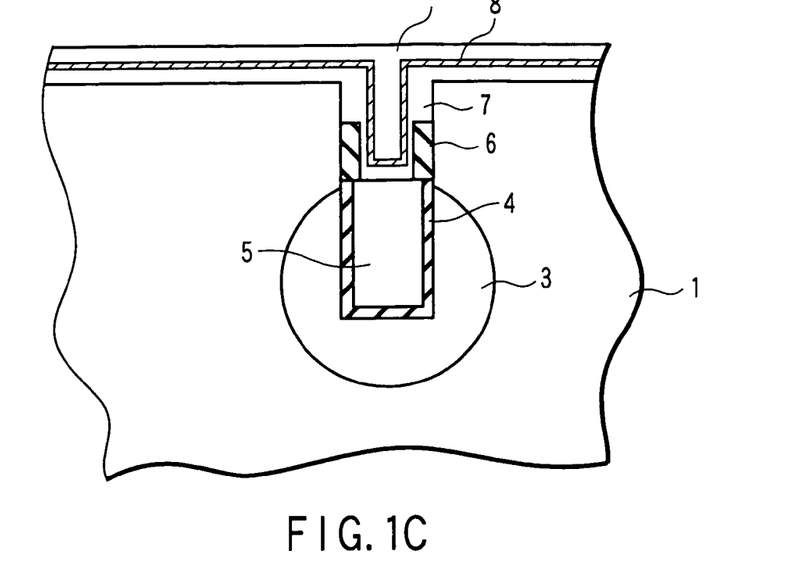
Figure 1D:
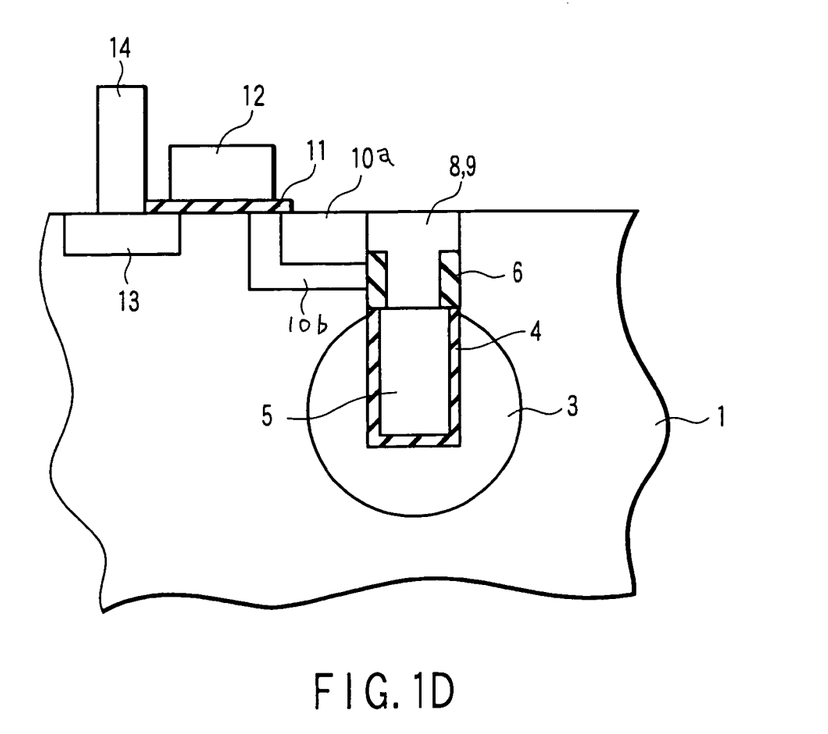

First of all, by making use of the flow of SiH$_4$ gas, a film of polycrystalline silicon is formed. Then, AsH$_3$ gas is permitted to flow over the polycrystalline silicon film 7 formed as described above to perform the adsorption of As as the first impurity onto the polycrystalline silicon film 7. Then, PH$_3$ gas is permitted to flow over the polycrystalline silicon film 7 having the As adsorbed thereon to perform the adsorption of P as the second impurity onto the polycrystalline silicon film 7. In FIG. 1C, the reference numeral 8 denotes an adsorption layer of As and P.

Further, SiH$_4$ gas is permitted to flow over the polycrystalline silicon or amorphous silicon film 7 having, on its surface, the adsorption layer 8 of As and P to form a polycrystalline silicon film 9. As a result, a structure having As/P-doped polycrystalline silicon buried in an upper portion of the trench is obtained.

Incidentally, in order to obtain predetermined quantities of adsorption of As and P, a sequence of the aforementioned steps may be repeated a plurality of times. In this case, in order to make the concentration of the As impurity region to be formed in a subsequent step 5 to 1000 times as high as the concentration of the P impurity region, the step of adsorbing P may preferably be optionally omitted. Namely, the ratio between the As adsorption step and the P adsorption step may be adjusted such that when the As adsorption step is to be repeated twice, the P adsorption step may be limited to once for instance.

Figure 3:
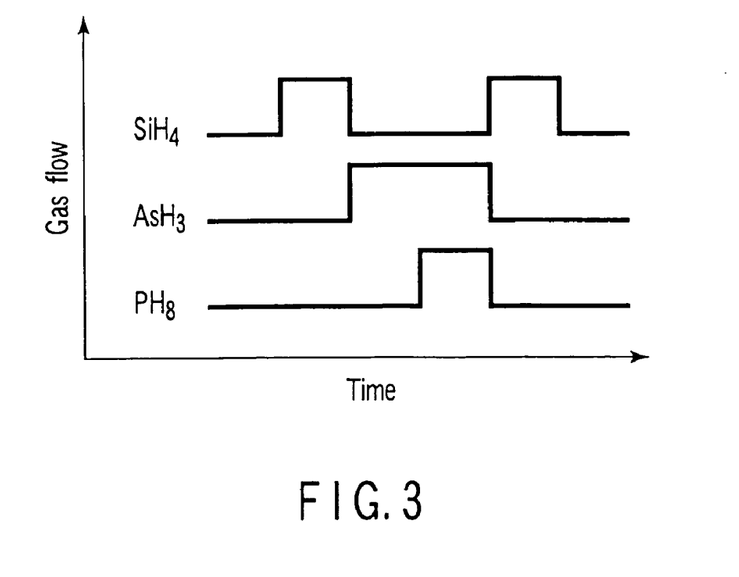
FIG. 3 is a graph illustrating, as another example, a sequence of each of gases to be employed in the formation of polycrystalline silicon containing both As and P.

The formation of polycrystalline silicon as well as the adsorption of As and P on the surface of the storage node electrode 5 in the trench 2 can be performed by following the procedure indicated by the sequence of gas flow shown in FIG. 3. In this sequence of gas flow, at first, SiH$_4$ gas is permitted to flow to form the polycrystalline silicon film 7, then AsH$_3$ gas is permitted to flow, and some time later, PH$_3$ gas is permitted to flow while continuing the flowing of the AsH$_3$ gas. Namely, at first, AsH$_3$ gas is permitted to flow to perform the adsorption of As and then PH$_3$ gas is permitted to flow while continuing the flowing of the AsH$_3$ gas to perform the concurrent adsorption of As and P. After the suspension of the AsH$_3$ gas flow and the PH$_3$ gas flow, SiH$_4$ gas is permitted to flow to form the polycrystalline silicon film 9 as in the case of the sequence of gas flow shown in FIG. 2.

According to this sequence of gas flow, it is possible, through suitable control of the ratio of flow rate (ratio of partial pressures) between the AsH$_3$ gas flow and the PH$_3$ gas flow, to control the appropriate quantities of adsorption of As and P.

As in the case of the sequence of gas flow shown in FIG. 2, a sequence of the aforementioned steps may be repeated a plurality of times and the step of adsorbing P may be optionally omitted.

Incidentally, the adsorption step of As and P in the sequence of gas flow shown in FIG. 2 may be optionally combined with the adsorption step of As and P in the sequence of gas flow shown in FIG. 3. For example, the adsorption of As and the adsorption of P may be separately performed in the first cycle and then the adsorption of P may be performed concurrent with the adsorption of As in the second cycle. Under some circumstances, a sequence of steps comprising the step of forming the polycrystalline silicon film by making use of SiH$_4$, which is interposed between the step of adsorbing As and the step of adsorbing P may be combined with the steps of adsorbing P and As.

The concentrations of As and P (quantity of adsorption) in the polycrystalline silicon film formed in this manner mentioned above are shown in the following Table. In this Table, Sample No. 1 represents one example wherein only As was adsorbed; Sample No. 2 represents one example wherein only P was adsorbed; Sample Nos. 3 and 4 represent examples wherein the adsorption of As and the adsorption of P were successively performed according the sequence of gas flow shown in FIG. 2; and Sample Nos. 5 to 8 represent examples wherein the adsorption of As and the adsorption of P were concurrently performed subsequent to the step of adsorbing only As according the sequence of gas flow shown in FIG. 3.

TABLE 1

| Sample No. | Doping method | Primary absorption | Secondary absorption | As conc. (/cm$^2$) | P conc. (/cm$^2$) |
|---|---|---|---|---|---|
| 1 | As adsorption | AsH$_3$ | — | $1 \times 10^{15}$ | — |
| 2 | P adsorption | PH$_3$ | — | — | $1 \times 10^{15}$ |
| 3 | As adsorption + P adsorption | AsH$_3$ | PH$_3$ (high pressure) | $9 \times 10^{14}$ | $1 \times 10^{14}$ |
| 4 | As adsorption + P adsorption | AsH$_3$ | PH$_3$ (low pressure) | $1 \times 10^{15}$ | $5 \times 10^{13}$ |
| 5 | As adsorption (As adsorption + P adsorption) | AsH$_3$ | Ration in partial pressure of As/P = 1 | $1 \times 10^{15}$ | $5 \times 10^{12}$ |

TABLE 1-continued

| Sample No. | Doping method | Primary absorption | Secondary absorption | As conc. (/cm²) | P conc. (/cm²) |
|---|---|---|---|---|---|
| 6 | As adsorption (As adsorption + P adsorption) | AsH₃ | Ration in partial pressure of As/P = 5 | $1 \times 10^{15}$ | $1 \times 10^{12}$ |
| 7 | As adsorption (As adsorption + P adsorption) | AsH₃ | Ration in partial pressure of As/P = 10 | $1 \times 10^{15}$ | $5 \times 10^{11}$ |
| 8 | As adsorption (As adsorption + P adsorption) | AsH₃ | Ration in partial pressure of As/P = 50 | $1 \times 10^{15}$ | $1 \times 10^{11}$ |

It will be recognized from above Table that, in the case of Sample Nos. 3 and 4 wherein the adsorption of As and the adsorption of P were successively performed, it was possible to realize the adsorption of a high concentration of As and the adsorption of a low concentration of P. Further, in the case of Sample Nos. 5 to 8 wherein the adsorption of As and the adsorption of P were concurrently performed subsequent to the step of adsorbing only As, it was possible, through suitable adjustment of the ratio in partial pressure between AsH₃ gas and PH₃ gas, to achieve a As concentration of about $1\times10^{15}$/cm² (quantity of adsorption) and a P concentration of about $1\times10^{11}$–$5\times10^{12}$/cm² (quantity of adsorption). Namely, it was possible to control the concentration of P so as to make it as low as not more than ¹⁄₁₀₀ of the concentration of As.

After producing the structure shown in FIG. 1C where an upper portion of the trench is buried with a polycrystalline silicon layer doped with As and P as described above, the polycrystalline silicon layers 7 and 9 on the surface of the substrate 1 are removed. Thereafter, by means of known process, the gate insulation film 11, gate electrode 12, source/drain P diffusion region 13, and bit line contact plug 14 of MOSFET are formed to accomplish the manufacture of the DRAM cell. In this case, the ordinary process of manufacturing the DRAM cell is inevitably accompanied with a heating step. However, during this heating step, As and P are permitted to diffuse in a lateral direction from the polycrystalline silicon films 7 and 9 existing at an upper portion of the trench, thereby forming a As diffusion region 10a and a P diffusion region 10b. Since the diffusion coefficient of P is higher than the diffusion coefficient of As, it is possible to create the P diffusion region 10b below the As diffusion region 10a, thereby enclosing the As diffusion region 10a.

Due to the provision of the As diffusion region 10a thus formed, the buried electrode of the capacitor is enabled to be connected with the MOSFET. In this case, since the As diffusion region 10a is enclosed by the P diffusion region 10b, it is now possible to effectively prevent the junction leak of the As diffusion region 10a.

Figure 4:
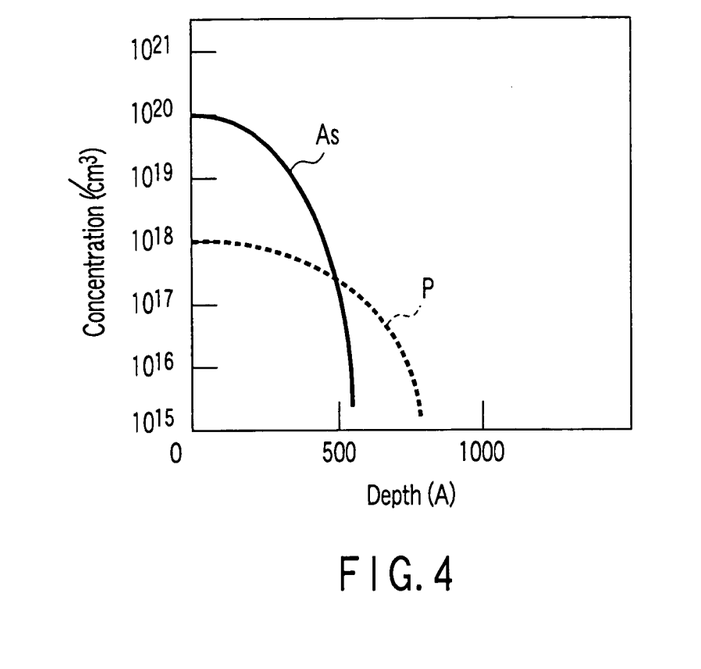
FIG. 4 is a graph illustrating one example of the concentration distribution of the As diffusion region and of the P diffusion region in the DRAM trench cell according to one embodiment of the present invention.

One example of the concentration distribution of the As diffusion region 10a and of the P diffusion region 10b is shown in FIG. 4. As seen from FIG. 4, while the concentration of As at the surface of silicon substrate was about $1\times10^{20}$/cm³, the concentration of P at the surface of silicon substrate was about $1\times10^{18}$/cm³, indicating a difference in concentration of 100:1. At the same time, since P was distributed to a deep region, it was possible to form a double diffusion region structure wherein a high-concentration As diffusion region was enclosed by a low-concentration P diffusion region. Due to the creation of this double diffusion region structure, it was possible to reduce the junction leak current of the As diffusion region 10a to about ¹⁄₁₀ as compared with the prior art.

EXAMPLES

The adsorption of impurities were performed under various conditions as described below and the impurities were permitted to solid-phase-diffuse in a heating step, thereby manufacturing six kinds of DRAM cell samples as described below. Then, for the purpose of investigating the junction leak of these samples, the cell-P well current thereof was measured.

DRAM cell sample No. 1: First of all, $7\times10^{14}$/cm² of As was adsorbed on the polycrystalline silicon film formed on the inner surface of trench. Then, a polycrystalline silicon film was deposited on the As-doped polycrystalline silicon film and $7\times10^{14}$/cm² of As was further adsorbed on the resultant polycrystalline silicon film. Finally, polycrystalline silicon was buried in the trench and $5\times10^{13}$/cm² of p was ion-implanted in the polycrystalline silicon at an accelerated voltage of 5 KeV.

DRAM cell sample No. 2: First of all, $7\times10^{14}$/cm² of As was adsorbed on the polycrystalline silicon film formed on the inner surface of trench, and then, $8\times10^{12}$/cm² of p was adsorbed. Thereafter, a polycrystalline silicon film was deposited on the As/P-doped polycrystalline silicon film and $7\times10^{14}$/cm² of As was further adsorbed on the resultant polycrystalline silicon film. Finally, polycrystalline silicon was buried in the trench.

DRAM cell sample No. 3: First of all, $7\times10^{14}$/cm² of As was adsorbed on the polycrystalline silicon film formed on the inner surface of trench, and then, $4\times10^{13}$/cm² of p was adsorbed. Thereafter, a polycrystalline silicon film was deposited on the As/P-doped polycrystalline silicon film and $7\times10^{14}$/cm² of As was further adsorbed on the resultant polycrystalline silicon film. Finally, polycrystalline silicon was buried in the trench.

DRAM cell sample No. 4: First of all, $7\times10^{14}$/cm² of As was adsorbed on the polycrystalline silicon film formed on the inner surface of trench, and then, $8\times10^{13}$/cm² of p was adsorbed. Thereafter, a polycrystalline silicon film was deposited on the As/P-doped polycrystalline silicon film and $7\times10^{14}$/cm² of As was further adsorbed on the resultant polycrystalline silicon film. Finally, polycrystalline silicon was buried in the trench.

DRAM cell sample No. 5: First of all, $7\times10^{14}$/cm² of As was adsorbed on the polycrystalline silicon film formed on the inner surface of trench, and then, a polycrystalline silicon film was deposited on the As-doped polycrystalline silicon film and $7\times10^{14}$/cm² of As was further adsorbed on the polycrystalline silicon film. Thereafter, $8\times10^{12}/\text{cm}^2$ of p was adsorbed thereon. Finally, polycrystalline silicon was buried in the trench.

DRAM cell sample No. 6: First of all, $7\times10^{14}/\text{cm}^2$ of As was adsorbed on the polycrystalline silicon film formed on the inner surface of trench, and then, a polycrystalline silicon film was deposited on the As-doped polycrystalline silicon film and $7\times10^{14}/\text{cm}^2$ of As was further adsorbed on the polycrystalline silicon film. Thereafter, $4\times10^{13}/\text{cm}^2$ of p was adsorbed thereon. Finally, polycrystalline silicon was buried in the trench.

Figure 5:
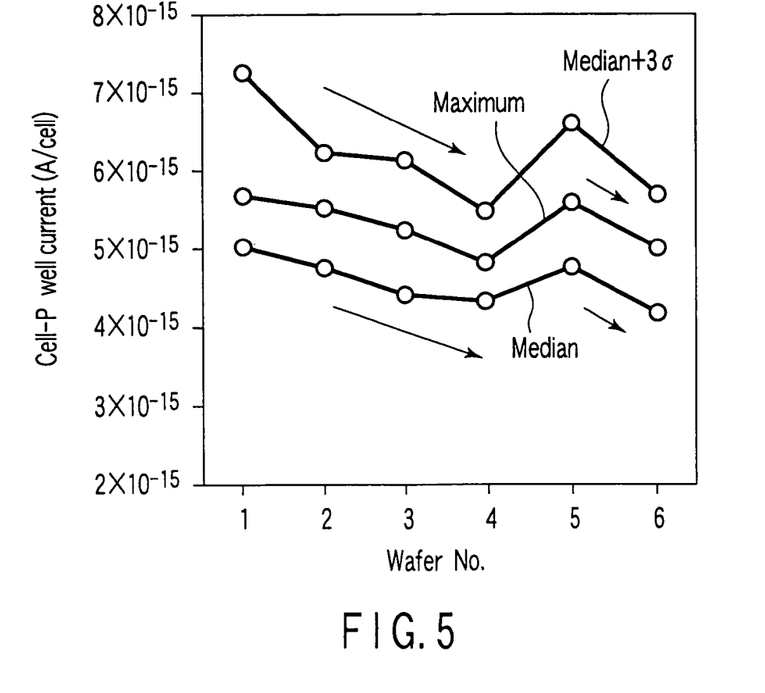
FIG. 5 is a graph illustrating the results measured of cell-P well current of the DRAM trench cell according to one example of the present invention.

The cell-P well current was measured on each of these DRAM cell samples, the results thereof are shown in FIG. 5.

It will be recognized from FIG. 5 that due to the adsorption of P in addition to the adsorption of As, it was possible to minimize the leak current and the non-uniformity of the leak current. Further, since the concentration of P was increased to a predetermined range, it was possible to minimize especially the leak current and the non-uniformity of the leak current. Incidentally, the DRAM cell sample No. 1 where P was doped by means of ion implantation indicated a relatively high leak current.

Although the foregoing embodiments are directed to cases wherein polycrystalline silicon was employed as a semiconductor film to be buried in the trench, the present invention should not be construed to be limited by these embodiments. Namely, even if amorphous silicon is substituted for polycrystalline silicon in these embodiments, it is possible to obtain the substantially same effects as explained above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, which comprises:
    forming a first semiconductor film including polycrystalline silicon or amorphous silicon on a surface of a semiconductor substrate;
    adsorbing a first impurity on a surface of the first semiconductor film;
    adsorbing a second impurity on the surface of the first semiconductor film having the first impurity adsorbed thereon;
    forming a second semiconductor film made of polycrystalline silicon or amorphous silicon on the surface of the first semiconductor film having the first and second impurities adsorbed thereon; and
    solid-phase-diffusing the first impurity and the second impurity into a region of the semiconductor substrate which is located adjacent to the first and second semiconductor films to thereby form a first diffusion region containing the first impurity and a second diffusion region containing the second impurity, a concentration of the first impurity in said first diffusion region being higher than that of the second impurity in said second diffusion region, and said first diffusion region having the bottom thereof covered by said second diffusion region.

2. The method according to claim 1, wherein the second impurity has a larger diffusion coefficient than that of the first impurity.

3. The method according to claim 1, wherein the first impurity and the second impurity are of the same conductivity type with each other and individually selected from the group consisting of As, P, Sb, B, Al, Ga and In.

4. The method according to claim 1, wherein the concentration of the first impurity in the first diffusion region is 5 to 1000 times larger than the concentration of the second impurity in the second diffusion region.

5. The method according to claim 1, wherein a sequence of adsorbing the first impurity, adsorbing the second impurity, and forming a second semiconductor film made of polycrystalline silicon or amorphous silicon are repeated a plurality of times.

6. The method according to claim 5, wherein at least one of the repetitions of said sequence is performed without adsorbing the second impurity.

7. The method according to claim 1, wherein adsorbing the first impurity and the second impurity is performed by exposing the first semiconductor film to gas containing the first impurity and then to gas containing the second impurity, and quantities of adsorbed first and second impurities are controlled by controlling the partial pressure of the gas containing the first impurity and the partial pressure of the gas containing the second impurity.

8. The method according to claim 7, wherein the first impurity is As, the gas containing the first impurity is $AsH_3$, the second impurity is P, the gas containing the second impurity is $PH_3$, and the ratio of partial pressure between $AsH_3$ and $PH_3$ ($AsH_3/PH_3$) is selected from the range of 1 to 50.

9. A method of manufacturing a semiconductor device, which comprises the steps of:
    forming a first semiconductor film including polycrystalline silicon or amorphous silicon on a surface of a semiconductor substrate;
    adsorbing a first impurity on a surface of the first semiconductor film;
    adsorbing a second impurity on the surface of the first semiconductor film in the middle of the previous step of applying the first impurity to the surface of the first semiconductor film;
    forming a second semiconductor film including polycrystalline silicon or amorphous silicon on the surface of the first semiconductor film having the first and second impurities adsorbed thereon; and
    solid-phase-diffusing the first impurity and the second impurity into a region of the semiconductor substrate which is located adjacent to the first and second semiconductor films to thereby form a first diffusion region containing the first impurity and a second diffusion region containing the second impurity, a concentration of the first impurity in said first diffusion region being higher than that of the second impurity in said second diffusion region, and said first diffusion region having the bottom thereof covered by said second diffusion region.

10. The method according to claim 9, wherein the second impurity has a larger diffusion coefficient than that of the first impurity.

11. The method according to claim 9, wherein the first impurity and the second impurity are of the same conductivity type with each other and individually selected from the group consisting of As, P, Sb, B, Al, Ga and In.

12. The method according to claim 9, wherein the concentration of the first impurity in the first diffusion region is 5 to 1000 times larger than the concentration of the second impurity in the second diffusion region.

13. The method according to claim 9, wherein a sequence of adsorbing the first impurity, adsorbing the second impurity, and forming a second semiconductor film including polycrystalline silicon or amorphous silicon are repeated a plurality of times.

14. The method according to claim 13, wherein at least one of the repetitions of said sequence is performed without adsorbing the second impurity.

15. The method according to claim 9, wherein adsorbing the first impurity and the second impurity is performed by exposing the first semiconductor film to gas containing the first impurity and then to gas containing the second impurity, and quantities of adsorbed first and second impurities are controlled by controlling the partial pressure of the gas containing the first impurity and the partial pressure of the gas containing the second impurity.

16. The method according to claim 15, wherein the first impurity is As, the gas containing the first impurity is $AsH_3$, the second impurity is P, the gas containing the second impurity is $PH_3$, and the ratio of partial pressure between $AsH_3$ and $PH_3$ ($AsH_3/PH_3$) is selected from the range of 1 to 50.

17. The method according to claim 1, wherein said semiconductor substrate has a trench, and said first semiconductor film is formed on an inner surface of the trench.

18. The method according to claim 15, wherein an insulating film is formed on lower inner surface of said trench, a semiconductor material is embedded in a lower portion of said trench, and said first semiconductor film is formed on an upper inner surface of the trench.

19. The method according to claim 18, wherein said insulating film formed on the lower inner surface of said trench is a capacitor insulating film of a capacitor, said semiconductor material embedded in a lower portion of said trench is a storage node electrode of a capacitor, said first diffusion region is a source or drain region of an MOS transistor, and said capacitor and MOS transistor forms a DRAM cell.

* * * * *